(12) United States Patent
Im et al.

(10) Patent No.: US 7,710,813 B1
(45) Date of Patent: May 4, 2010

(54) ELECTRONIC FUSE ARRAY

(75) Inventors: Hsung Jai Im, Cupertino, CA (US);
Sunhom Paak, San Jose, CA (US);
Raymond C. Pang, San Jose, CA (US);
Boon Yong Ang, Santa Clara, CA (US);
Serhii Tumakha, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 105 days.

(21) Appl. No.: 12/043,099

(22) Filed: Mar. 5, 2008

(51) Int. Cl.
*G11C 17/18* (2006.01)
(52) U.S. Cl. .................................. 365/225.7; 365/96
(58) Field of Classification Search .............. 365/225.7, 365/96, 103
See application file for complete search history.

(56) References Cited

U.S. PATENT DOCUMENTS

| | | | |
|---|---|---|---|
| 4,219,836 A | 8/1980 | McElroy | |
| 4,238,839 A | 12/1980 | Redfern et al. | |
| 4,647,340 A | 3/1987 | Szluk et al. | |
| 4,872,140 A | 10/1989 | Graham et al. | |
| 5,166,758 A | 11/1992 | Ovshinsky et al. | |
| 6,060,743 A | 5/2000 | Sugiyama et al. | |
| 6,208,549 B1 * | 3/2001 | Rao et al. | 365/96 |
| 6,258,700 B1 | 7/2001 | Bohr et al. | |
| 6,496,416 B1 | 12/2002 | Look | |
| 6,522,582 B1 | 2/2003 | Rao et al. | |
| 6,525,397 B1 | 2/2003 | Kalnitsky et al. | |
| 6,597,013 B2 | 7/2003 | Romas, Jr. et al. | |
| 6,671,205 B2 | 12/2003 | Look | |
| 6,703,680 B2 | 3/2004 | Toyoshima | |
| 6,804,159 B2 | 10/2004 | Kamiya et al. | |
| 6,807,079 B2 | 10/2004 | Mei et al. | |
| 6,882,571 B1 | 4/2005 | Look | |
| 6,911,360 B2 | 6/2005 | Li et al. | |
| 6,930,920 B1 | 8/2005 | Look | |
| 6,936,527 B1 | 8/2005 | Look | |
| 7,026,692 B1 | 4/2006 | Look | |
| 7,068,072 B2 | 6/2006 | New et al. | |
| 7,092,273 B2 | 8/2006 | Look | |
| 7,098,721 B2 | 8/2006 | Ouellette et al. | |
| 7,180,102 B2 | 2/2007 | Hui | |
| 7,529,148 B2 * | 5/2009 | Shah et al. | 365/225.7 |
| 2004/0124458 A1 | 7/2004 | Kothandaraman | |
| 2006/0158920 A1 * | 7/2006 | Sumi et al. | 365/96 |
| 2008/0316789 A1 * | 12/2008 | Fredeman et al. | 365/96 |

OTHER PUBLICATIONS

Toyoji Yamamoto et al., "Bias Temperature Instability in Scaled p+ Polysilicon Gate p-MOSFET's," IEEE Transactions on Electron Devices, vol. 46, No. 5, May 1999, IEEE, 3 Park Avenue, 17th Floor, New York, NY 10016-5997.

(Continued)

*Primary Examiner*—Vu A Le
(74) *Attorney, Agent, or Firm*—Scott Hewett (57) ABSTRACT

An electronic fuse memory array has an array core with a plurality of selectable unit cells. A unit cell has a fuse and a cell transistor (M12). A programming current path goes through the fuse and the cell transistor to a word line ground and a read current path also goes through the fuse and the cell transistor to the word line ground.

17 Claims, 8 Drawing Sheets

OTHER PUBLICATIONS

Se-Aug Jang et al., "Effects of Thermal Processes After Silicidation on the Performance of TiSi2/Polysilicon Gate Device," IEEE Transactions on Electron Devices, vol. 46, No. 12, Dec. 1999, pp. 2353-2356, IEEE, 3 Park Avenue, 17th Floor, New York, NY 10016-5997.

Rahman, Arifur et al., "Die Stacking Technology for Terabit Chip-to-Chip Communications", Proceedings of 2006 IEEE Custom Integrated Circuits Conference (CICC), Sep. 10-13, 2006, available from IEEE, 3 Park Avenue, 17th Floor, New York, NY 10016-5997.

N. Kimizuka et al., "NBTI enchancement by nitrogen incorporation into ultrathin gat oxide for 0.10-um gate CMOS generation," 2000 Symposium on VLSI Technology Digest of Technical Papers, Apr. 2000, pp. 92-93, IEEE, 3 Park Avenue, 17th Floor, New York, NY 10016-5997.

Mohsen Alavi et al., A Prom Element Based on Salicide Agglomeration of Poly Fuses in a CMOS Logic Process, Jul. 1997, pp. 855-858, IEEE, 3 Park Avenue, 17th Floor, New York, NY 10016-5997.

Jerome B. Lasky et al., "Comparison of Transformation to Low-Resistivity Phase and Agglomeration of TiSi2 and CoSi2," IEEE Transactions on Electron Devices, vol. 38, No. 2, Feb. 1991, pp. 262-269, IEEE, 3 Park Avenue, 17th Floor, New York, NY 10016-5997.

Alexander Kalnitzky et al., CoSi2 integrated fuses on poly silicon for low voltage 0.18um CMOS applications, Sep. 1999, pp. 765-768 IEEE, 3 Park Avenue, 17th Floor, New York, NY 10016-5997.

U.S. Appl. No. 12/043,910, filed Mar. 6, 2008, Im, Hsung Jai et al., Xilinx, Inc. 2100 Logic Drive, San Jose, CA 95124.

U.S. Appl. No. 12/043,103, filed Mar. 5, 2008, Im, Hsung Jai, et al., Xilinx, Inc. 2100 Logic Drive, San Jose, CA 95124.

U.S. Appl. No. 12/043,091, filed Mar. 5, 2008, Im, Hsung Jai, et al., Xilinx, Inc. 2100 Logic Drive, San Jose, CA 95124.

U.S. Appl. No. 12/043,914, filed Mar. 6, 2008, Im, Hsung Jai et al., Xilinx, Inc. 2100 Logic Drive, San Jose, CA 95124.

U.S. Appl. No. 11/973,062, filed Oct. 4, 2007, Rahman, Arifur et al., Xilinx, Inc. 2100 Logic Drive, San Jose, CA 95124.

U.S. Appl. No. 11/799,886, filed May 2, 2007, Sidhu, Lakhbeer S. et al., Xilinx, Inc. 2100 Logic Drive, San Jose, CA 95124.

U.S. Appl. No. 11/717,836, filed Mar. 13, 2007, Oh, Kwansuhk, et al., Xilinx, Inc. 2100 Logic Drive, San Jose, CA 95124.

U.S. Appl. No. 11/588,775, filed Oct. 27, 2006, Paak, Sunhom et al., Xilinx, Inc. 2100 Logic Drive, San Jose, CA 95124.

U.S. Appl. No. 11/449,171, filed Jun. 8, 2006, Ang, Boon Yong et al., Xilinx, Inc. 2100 Logic Drive, San Jose, CA 95124.

* cited by examiner

ELECTRONIC FUSE ARRAY

FIELD OF THE INVENTION

This invention relates generally to integrated circuits ("ICs"), and more particularly to non-volatile memory arrays of electronic fuses ("E-fuses").

BACKGROUND OF THE INVENTION

Many ICs are made up of millions of interconnected devices, such as transistors, resistors, capacitors, and diodes, on a single chip of semiconductor substrate. It is generally desirable that ICs operate as fast as possible, and consume as little power as possible. Semiconductor ICs often include one or more types of memory, such as CMOS memory, antifuse memory, and E-fuse memory.

One-time-programmable ("OTP") memory elements are used in ICs to provide non-volatile memory ("NVM"). Data in NVM are not lost when the IC is turned off. NVM allows an IC manufacturer to store lot number and security data on the IC, for example, and is useful in many other applications. One type of NVM is commonly called an E-fuse.

E-fuses are usually integrated into semiconductor ICs by using a narrow stripe (commonly also called a "fuse link") of conducting material (metal, polysilicon, etc.) between two pads, generally referred to as anode and cathode. Applying a programming current ($I_{prog}$) to the E-fuse destroys (fuses) the link, thus changing the resistance of the E-fuse. This is commonly referred to as "programming" the E-fuse. The fuse state (i.e., whether it has been programmed) can be read using a sense circuit, which is common in the art of electronic memories.

During programming, current is applied through the fuse link for a specified period. The programming current heats up the fuse link more than the adjacent areas due to current crowding and differences in heat dissipation, creating a temperature gradient. The temperature gradient and the carrier flux causes electro- and stress-migration to take place and drive material (e.g., silicide, dopant, and polysilicon) away from the fuse link.

Programming generally converts the E-fuse from an original resistance (e.g., about 200 Ohms) to a programmed resistance (e.g., greater than 10,000 Ohms). It is desirable for the programmed resistance to be much higher (typically many orders of magnitude higher) than the original resistance to allow reliable reading of the E-fuse using a sensing circuit. A first logic state (e.g., a logical "0") is typically assigned to an unprogrammed, low-resistance fuse state, and a second logic state (e.g., a logical "1") to the programmed, high-resistance fuse state. The change in resistance is sensed (read) by a sensing circuit to produce a data bit.

Figure 1A:
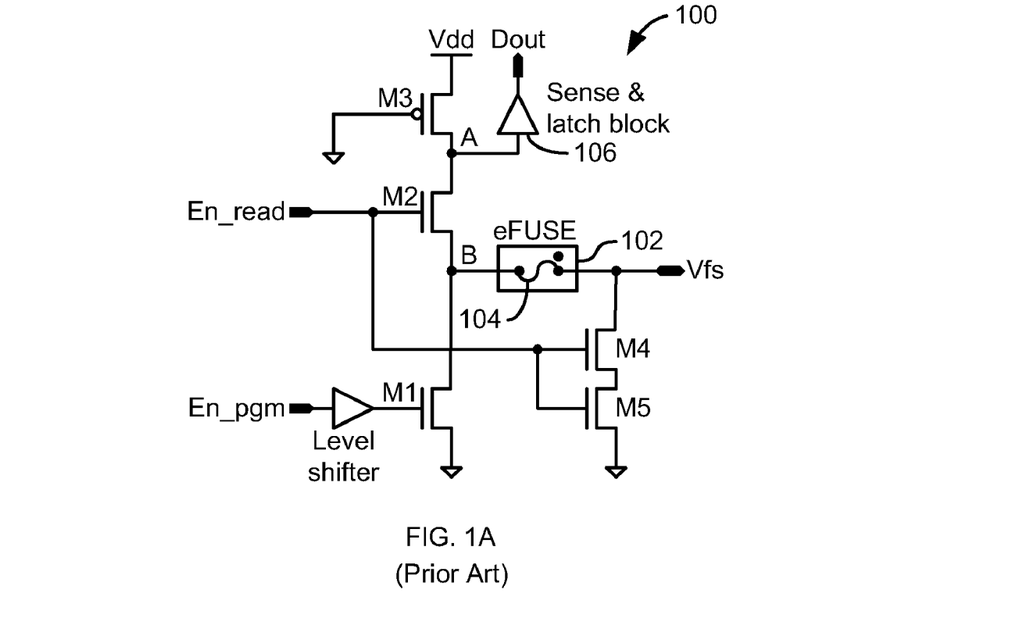
FIG. 1A is a diagram of a prior art E-fuse cell 100.

FIG. 1A is a diagram of a prior art E-fuse cell 100. The E-fuse cell 100 includes an E-fuse 102 with an E-fuse link 104. The E-fuse link 104 is often polysilicon, silicided polysilicon, or other suitable fuse link material. The E-fuse cell 100 is incorporated into an IC having multiple gate oxide thicknesses. Transistors M1, M2, M4 and M5 have been fabricated using a thicker oxide, which allows relatively higher voltages to be applied to these transistors. PMOS transistor M3 and transistors (not separately shown) in the sense and latch block 106 have been fabricated using a thinner oxide, which allows these transistors to operate at a lower voltage, which can be a core voltage as low as about one Volt. Fuse voltage ("Vfs") is a voltage supply pad typically shared by many fuses in an E-fuse memory array and is used to program the E-fuse 102, as described in association with FIG. 1B.

Figure 1B:
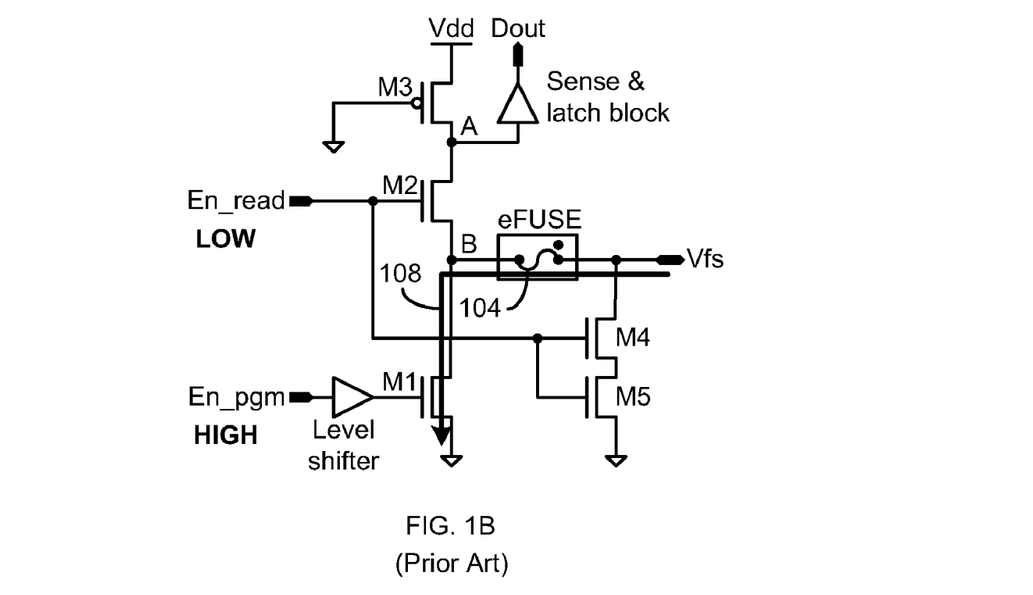
FIG. 1B is a diagram of the E-fuse cell of FIG. 1A illustrating a programming operation.

FIG. 1B is a diagram of the E-fuse cell of FIG. 1A illustrating a programming operation. During a programming operation, PROGRAM enable ("En_pgm") is a logic one (HIGH), READ enable ("En_read") is a logic zero (LOW), and a programming voltage (typically about 2.5 V to about 3.3 V) is applied to Vfs. Transistors M2 and M4/M5 are OFF and M1 is ON. Programming current, represented as line 108, flows from Vfs through the fuse link 104 and transistor M1 to ground. This current is typically about 10 mA for a selected period (programming time, Tpgm) and changes the resistance of the fuse from a low-resistance condition to a high resistance condition, as described above. Transistor M2 isolates, and thus protects, the thin-oxide transistors (e.g., M3) from high voltage on the programming path 108. Transistor M1 has a relatively large gate width in order to sink the programming current, and thus occupies a large percentage of the E-fuse cell area.

Figure 1C:
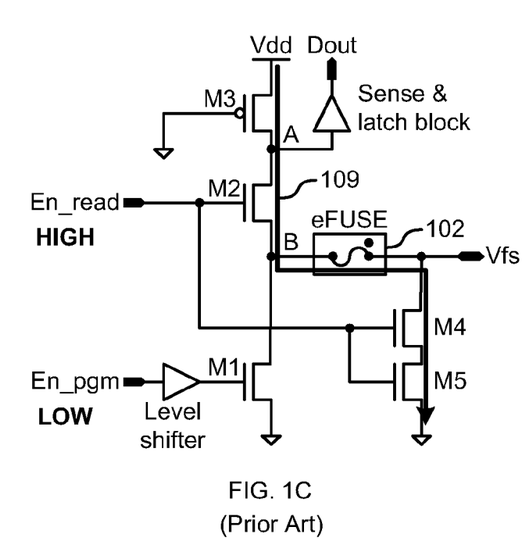
FIG. 1C is a diagram of the E-fuse cell of FIG. 1A illustrating a READ operation.

FIG. 1C is a diagram of the E-fuse cell of FIG. 1A illustrating a READ operation. During a READ operation, En_read is a logic 1 and En_pgm is a logic zero. No voltage is applied at Vfs. Transistor M1 is OFF, and transistors M2, M4, and M5 are ON. Transistor M3 is also ON because the gate of M3 is grounded. Transistors M3, M2, the fuse 102, M4, and M5 form a voltage divider with an output at node A. Transistors M4, M5, and M2 are designed to be strong (thick oxide devices) and to have sufficiently low resistances when ON so that they do not have an appreciable effect on the voltage at node A. The voltage at node A is primarily a function of M3 and the fuse resistance. Although the fuse link is typically "blown" in a programming operation, the result is a high-resistance path through the fuse 102, thus the fuse link is represented as providing an electrical path, whether representing a pristine (as-fabricated) or programmed (blown) condition.

When the fuse is unprogrammed (low resistance), node A is at a relatively low voltage during a READ operation. When the fuse has been programmed (high resistance), node A is at a high voltage during a READ operation. During a READ operation, the sense and latch block 106 senses the voltage at node A and produces a first logic value for a programmed fuse and a second logic value for an unprogrammed fuse.

Since transistor M4 is directly connected to a pad, it needs to follow special layout rules for ESD and latchup protection. These layout rules typically include guard rings and stacking the M4 transistor on top of another NMOS transistor (i.e., M5), which uses significant area on the silicon IC.

E-fuse memory arrays that provide more efficient use of silicon area are desirable.

SUMMARY OF THE INVENTION

An electronic fuse memory array has an array core with a plurality of selectable unit cells. A unit cell has a fuse and a cell transistor. A programming current path goes through the fuse and the cell transistor to a word line ground and a read current path also goes through the fuse and the cell transistor to the word line ground.

DETAILED DESCRIPTION OF THE DRAWINGS

Figure 2A:
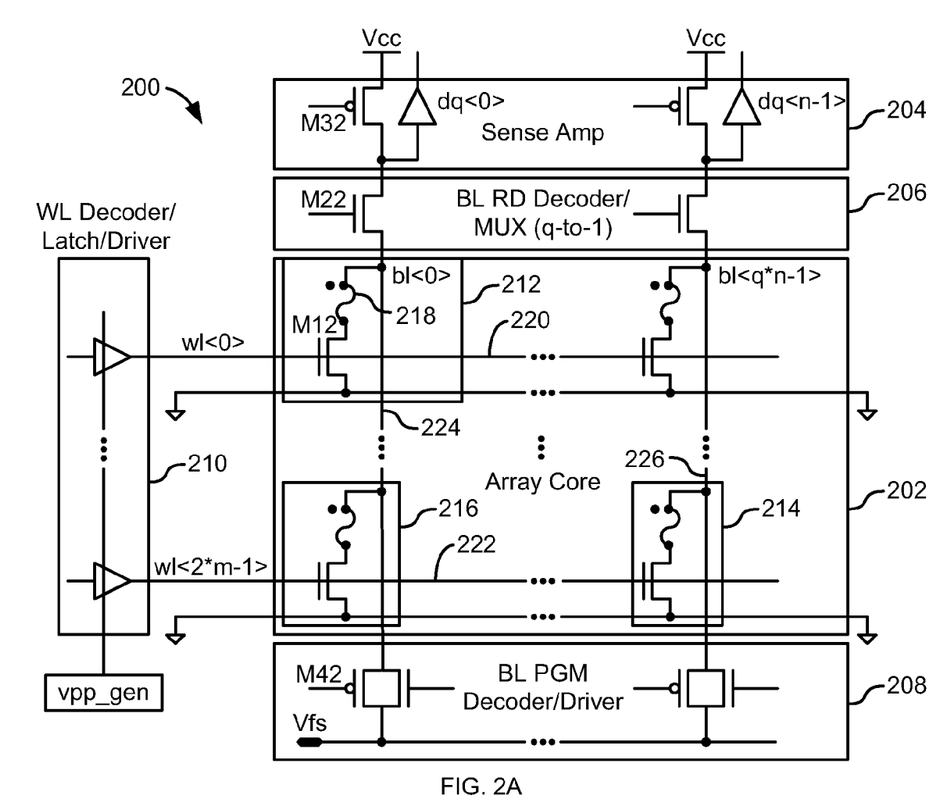
FIG. 2A is a diagram of an E-fuse memory array 200 according to an embodiment.

FIG. 2A is a diagram of an E-fuse memory array 200 according to an embodiment. The E-fuse memory array 200 shares functional blocks common to multiple bits (unit cells) that are connected to word lines and bit lines in an array core 202. The E-fuse memory array 200 has a reduced area on the silicon chip compared to conventional E-fuse memory arrays and provides a more flexible and portable interface to other circuits in an FPGA.

The E-fuse memory array 200 includes a sense amplifier array 204, a bit line READ decoder/multiplexer 206, a bit line PROGRAM decoder/driver 208, and a word line decoder/latch/driver ("word line decoder") 210, in addition to the array core 202. The array core 202 has several (for example, several thousand) unit cells 212, 214, 216. A unit cell 212 includes a fuse 218 and a cell transistor M12. In a particular embodiment, the fuse is an E-fuse having an E-fuse link made of polysilicon, metal, silicide, or other material or combinations of materials. Other types of E-fuse links or other types of fuses are alternatively used. Generally, a fuse has a resistance in a programmed state that is at least five times greater than an as-fabricated (pristine) resistance, and programming irreversibly changes the resistance of the fuse to the higher state.

The unit cells are connected to word lines ("WLs") 220, 222 and bit lines ("BLs") 224, 226 in the array core 202. In this example, there are q*n bit lines and 2*m word lines. For purposes of convenient discussion, the source/drain terminals of the cell transistor M12 will be referred to as first and second current terminals, and the gate terminal will be referred to as a control terminal.

The word line decoder 210 controls transistor gates for both READ and PROGRAM operations of cells by applying bias on a selected word line. The bit line READ decoder 206 connects the array core 202 with sense circuitry in the sense amplifier array 204. The bit line READ decoder 206 decodes a BL address of a selected unit cell (which has a corresponding WL address) and multiplexes the selected unit cell to a corresponding sense circuit. Thus, each unit cell has a unique WL/BL address and can be individually accessed. The cell transistor M12 is used in both the PROGRAM and READ operations (compare, FIG. 1A, ref nums. M1, M4/M5, which uses a first path to ground for programming and a second path to ground for reading).

Figure 2B:
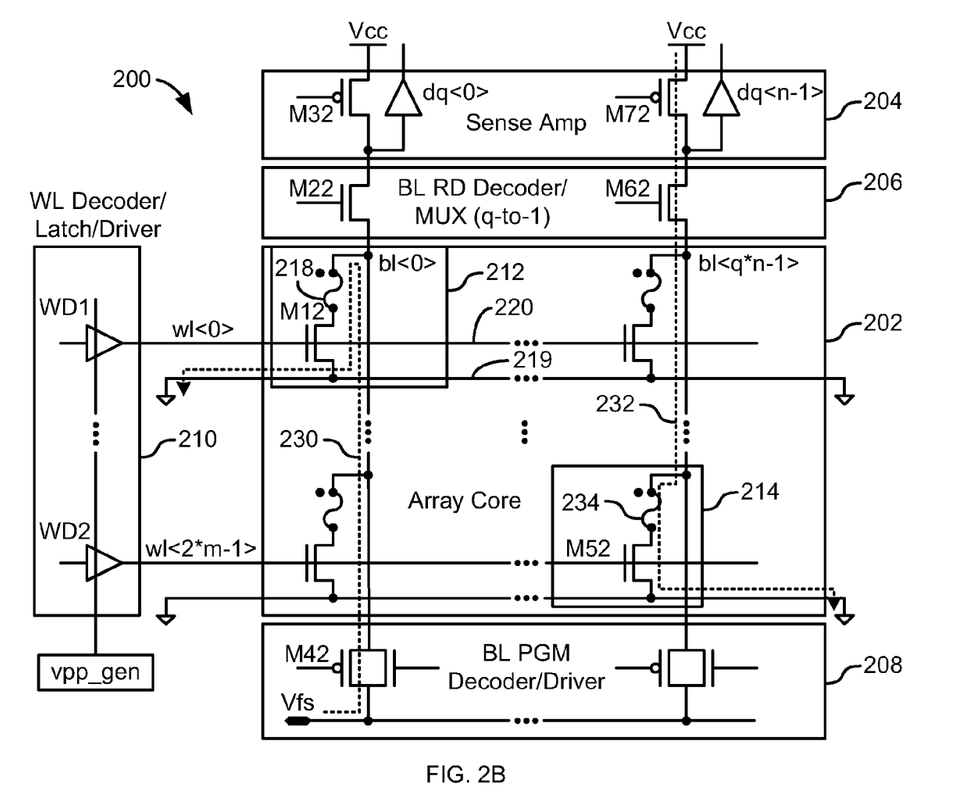
FIG. 2B illustrates programming and read operations in the E-fuse memory array of FIG. 2A.

FIG. 2B illustrates programming and read operations in the E-fuse memory array of FIG. 2A. The array core 202 is typically not simultaneously programmed and read. Both operations are shown in a single figure for convenience and ease of discussion.

For a programming operation, a high voltage (e.g., about 2 V to about 4V) is applied to a program supply node ("programming current source") Vfs and pass-gate M42 is turned on to selected BL<0>. The word line driver WD1 drives selected WL<0> for a selected programming time, typically about one hundred microseconds to about one millisecond. The cell transistor M12 of the selected unit cell 212 then turns on, allowing programming current to flow along programming current path 230 through the selected fuse 218, the cell transistor M12, and a word line ground 219, programming the fuse. The word line ground 219 provides a common ground path for each of the unit cells on (selectable by) the word line 220. During the programming operation, the unselected switches in the bit line READ decoder 206, bit line PROGRAM decoder 208, and word line decoder 210 are OFF.

During a READ operation, READ bit line transistor M62 and word line driver WD2 are turned ON (addressed) to activate the selected unit cell 214. The read current follows the read current path 232 from PMOS current source transistor M72 in the sense amplifier array 204 through M62 to the selected fuse 234, which is shown as being in the current path because, even if blown, it provides a high-resistance current path. The READ current 232 continues through the cell transistor M52 to ground. In a particular embodiment, the sensing mechanism is essentially the same as described in association with FIG. 1A.

The E-fuse memory array 200 reduces the area required for a unit cell (bit) by utilizing common circuit blocks outside of the array core, and by sharing READ and PROGRAM transistors for current sinking (e.g., replacing M1 and M4/M5 in FIG. 1A with shared devices). The E-fuse memory array 200 makes especially efficient use of silicon area because several of the shared devices are physically large devices.

Figure 3A:
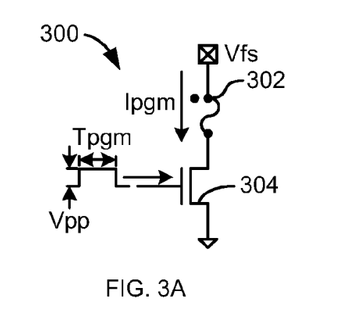
FIG. 3A is a diagram of an E-fuse unit cell according to an embodiment.

FIG. 3A is a diagram of an E-fuse unit cell 300 according to an embodiment. The unit cell 300 has a fuse 302 and a cell transistor 304. Programming an E-fuse having a polysilicon or silicided fuse line involves very sensitive electro-migration and localized heating. In order to properly program the fuse (i.e., to obtain a desirably high programmed resistance) programming current Ipgm and programming time Tpgm must be closely controlled. The cell transistor 304 must be capable of sinking Ipgm, which is typically a relatively large amount of current (about 10 mA in some applications), in saturation mode. At the same time, overdrive must be small enough to allow large $V_{DS}$ room because the load (fuse) resistance changes during programming. Thus, the cell transistor 304 is relatively large and takes up a significant portion of the unit cell area.

Figure 3B:
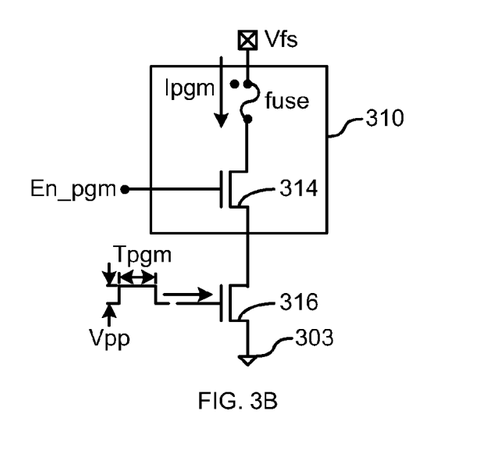
FIG. 3B is a diagram of an E-fuse unit cell according to another embodiment.

FIG. 3B is a diagram of an E-fuse unit cell 310 according to another embodiment. The unit cell 310 has a small ("switch") cell transistor 314 that is cascoded with a larger ("tail") transistor 316 that is outside of the unit cell 310, between the switch transistor 314 and ground 303. The cascoded switch transistor/tail transistor resembles a half portion of a differential pair, the tail transistor connecting a virtual ground (see FIG. 3C, ref. num. 322), which is shared by several unit cells, to ground 303. The virtual ground level swings, however, unlike as in small signal operation of a differential stage, during normal fuse pgm/read operation. The cell transistor 314 is a switch transistor that is turned on with a program enable (En_pgm) signal. The switch transistor 314 can be physically smaller than the cell transistor 304 in FIG. 3A because the switch transistor 314 can be overdriven by maximum supply voltage during fuse programming, and operate in the lower resistance triode regime.

During programming, control of programming current Ipgm is achieved by controlling the tail transistor 316 with the programming pulse Tpgm. The tail transistor 316 can be as large or larger than the cell transistor 304 in FIG. 3A because the tail transistor can be utilized (shared) by many unit cells, and the tail transistor area is not repeated in each unit cell. For example, a single tail transistor might be shared by all the unit cells on a common word line, allowing a large, robust tail transistor to be fabricated while decreasing silicon area compared to a comparable array core where each unit cell includes a transistor capable of switching Ipgm. Switch transistor 314 is also switching Ipgm; however, tail transistor 316 sources (regulates) Ipgm to a specified level.

Figure 3C:
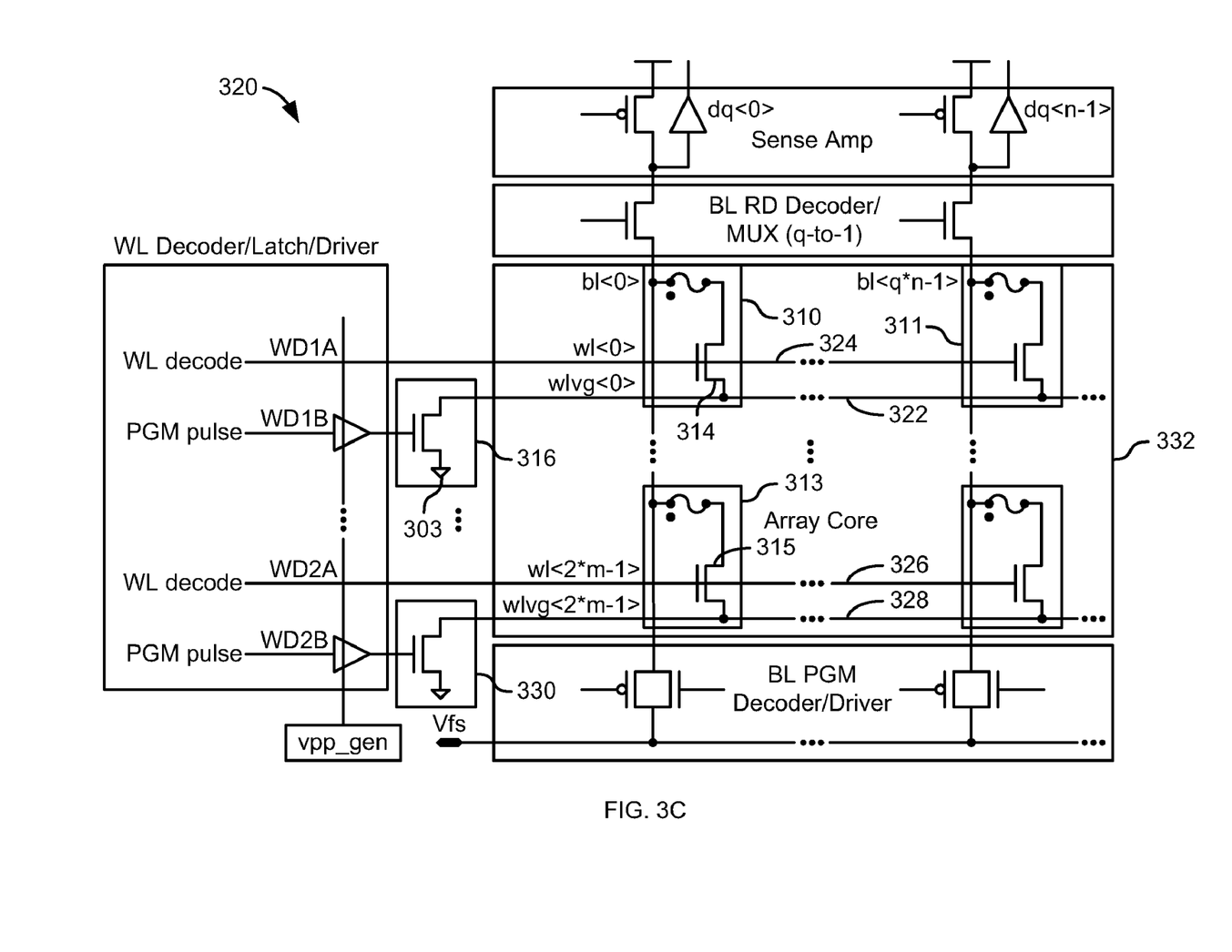
FIG. 3C is a diagram of an E-fuse memory array according to another embodiment.

FIG. 3C is a diagram of an E-fuse memory array 320 according to another embodiment. The memory array 320 has a tail transistor 316 on a ground line ("word line virtual ground") 322 common to the unit cells 310, 311 on word line wl<0> 324. Other word lines, e.g., wl<2*m−1> 326, similarly have word line grounds wlvg<2*m−1> 328 with a tail transistor 330. The tail transistors 316, 330 are shown outside of the array core 332, but are alternatively placed within (i.e., along an edge) of the array core, or elsewhere in the E-fuse memory array 320.

Each word line is accompanied by a virtual ground line in parallel, to which the shared tail transistor connects to sink current outside of the array core whenever that particular word line is selected for a READ or PROGRAM operation. The large, commonly shared tail transistors 316, 330 allow smaller cell transistors 314, 315 to be used in the unit cells 310, 313 of the array core 332, compared to the cell transistors illustrated in FIG. 2A, for example.

Figure 3D:
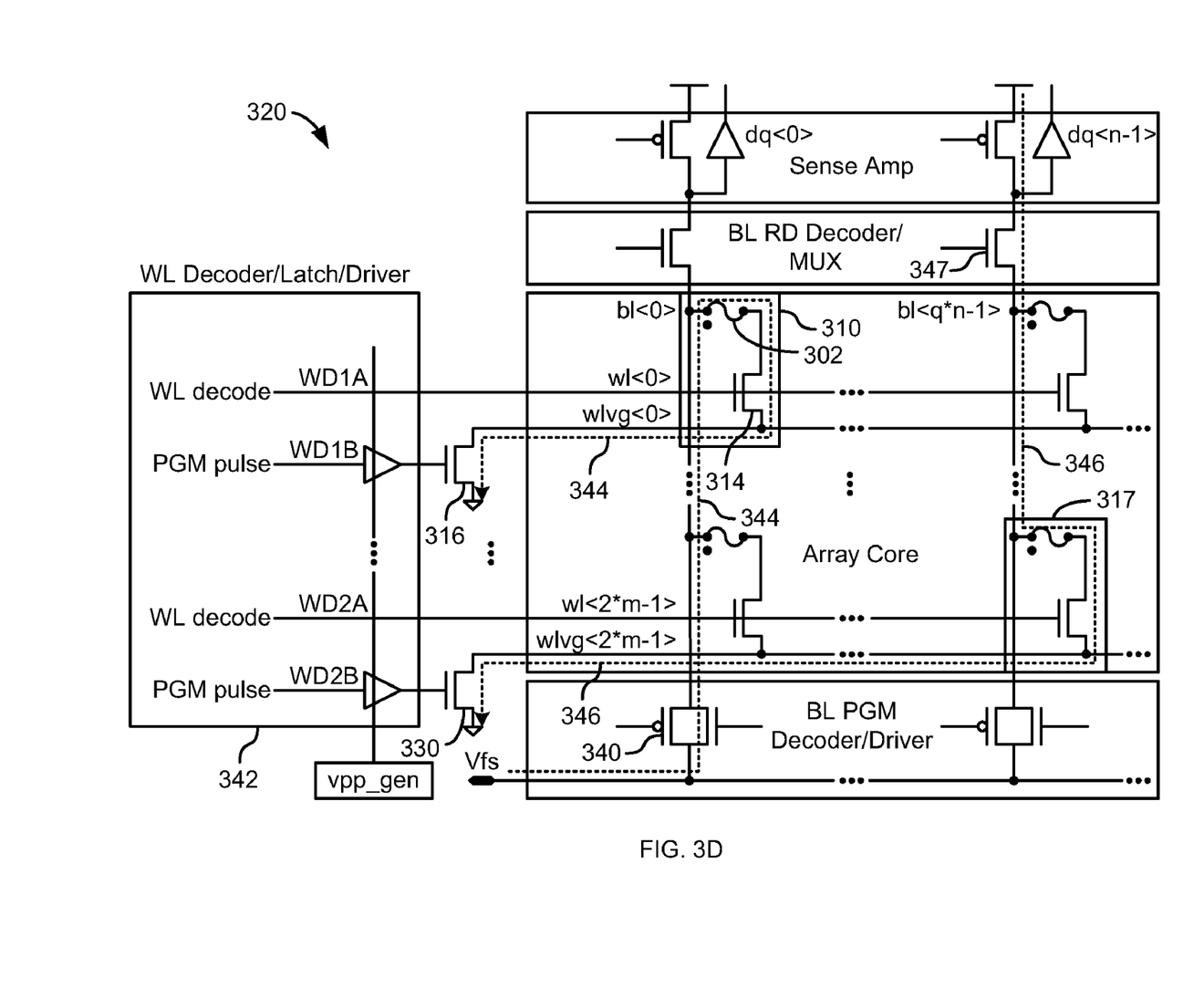
FIG. 3D illustrates programming and read operations in the E-fuse memory array of FIG. 3C.

FIG. 3D illustrates programming and read operations in the E-fuse memory array 320 of FIG. 3C. PROGRAM and READ operations are not typically done concurrently within the same memory bank. A single figure is used to illustrate both operations for clarity and ease of discussion. The switch transistor 314 is cascoded with the tail transistor 316, as described above in reference to FIG. 3B.

During programming, a high voltage (typically about 2 V to about 4 V) is applied to Vfs and passgate 340 is turned ON by the selected bit line address for bl<0>. Then the word line driver WD1A drives the selected wl<0>, turning switch transistor 3140N, after which tail transistor 316 is pulsed by WD1B driver to program the fuse 302. Alternatively, the tail transistor is turned ON before the switch transistor. During the PROGRAM operation, all the unselected switches are OFF. The PROGRAM current path is shown by the dashed line 344.

For the READ operation, bit line READ switch transistor 347 and word line driver WD2A, WD2B are turned ON to activate unit cell 317. The READ current path is shown by the dashed line 346. The sensing technique is essentially the same as described in reference to FIG. 1C.

A consideration for the memory array 320 during a PROGRAM operation is that the unselected bit lines are all connected to the selected bit line virtual ground associated with the selected word line, which is pulled down by a programming select transistor. In FIG. 3D, the program path wl<0> turns all cell transistors along wl<0> ON, connecting all of the unselected bit lines (bl<1> to bl<q*n−1>) to the associated word line virtual ground wlvg<0>, through fuses in the non-selected cells. Therefore, the unselected bit lines are left floating during a PROGRAM operation.

The cumulative parasitic capacitance on the selected word line virtual ground due to the unselected bit lines can influence the transient behavior of fuse current ramp-up and ramp-down. Transient waveforms of the programming current can affect E-fuse programming behavior. In some embodiments, it is desirable to suppress the parasitic capacitive loading on the programming circuit.

Figure 3E:
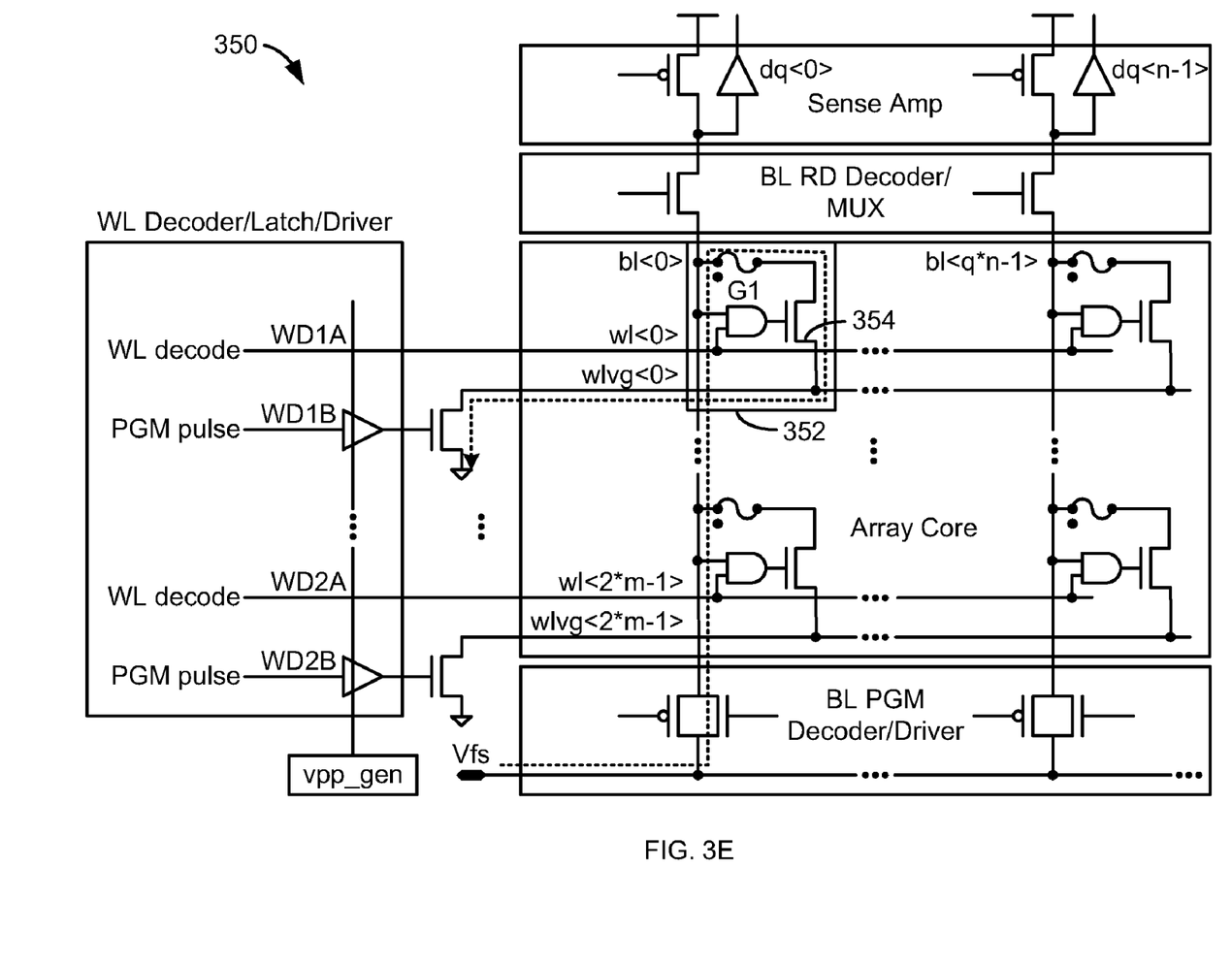
FIG. 3E is a diagram of an E-fuse memory array with an E-fuse unit cell according to another embodiment.

FIG. 3E is a diagram of an E-fuse memory array 350 with an E-fuse unit cell 352 according to another embodiment. The unit cell 352 has a logic gate (AND gate) G1 that turns the selected cell ON and shuts non-selected cells OFF. Several, typically all, of the unit cells along a word line, or several or all cells in the array core, have similar logic gates. Other logic functions are used in alternative embodiments to isolate the non-selected unit cells from the word line virtual ground associated with a selected word line. The logic gate G1 turns the switch transistor 3540N when both the word line input to the logic gate and the bit line input to the logic gate are asserted. The logic gates in the non-selected cells isolate the cell parasitics from the virtual ground line, reducing loading by de-coupling the non-selected cells from the other bit lines. The logic gate G1 is relatively small in relation to the area of the switch transistor and fuse of the unit cell 352, and adding a logic gate to each unit cell incurs only a small additional increase in unit cell area, if any.

Figure 4A:
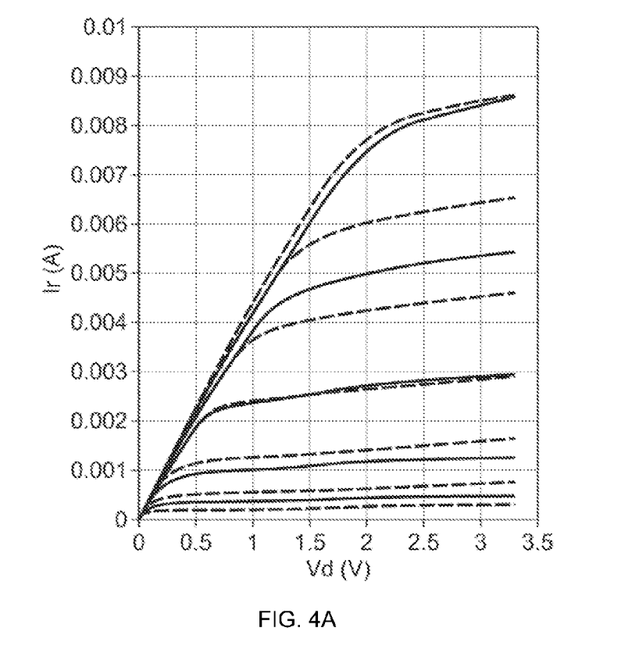
FIG. 4A shows simulated plots of current versus voltage for a conventional cell and for an embodiment.
Figures 4B, 5:
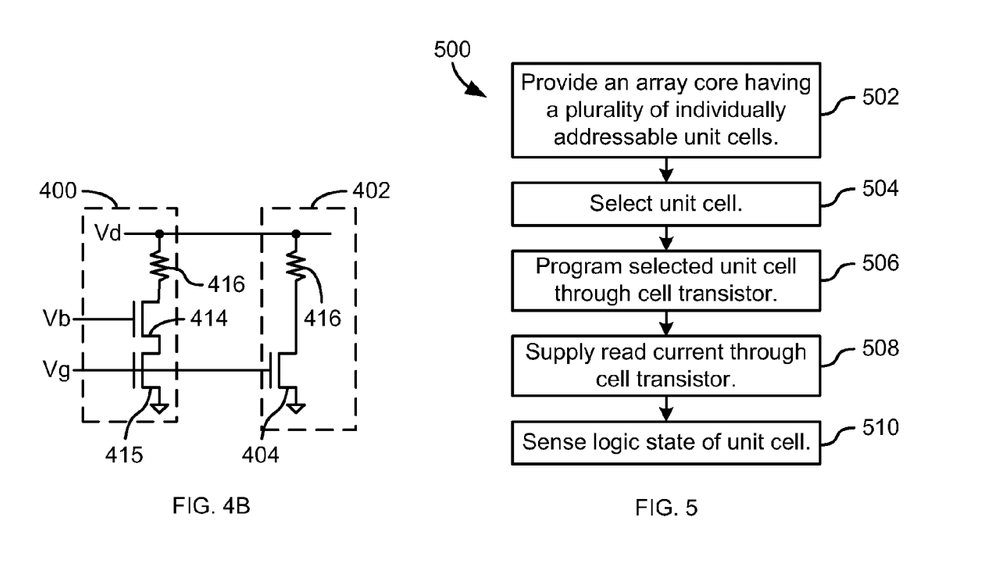
FIG. 4B is a diagram of circuit models used to generate the simulated plots in FIG. 4A.
FIG. 5 is a flow chart of a method of operating an E-fuse memory array according to an embodiment.

FIG. 4A shows simulated current versus voltage characteristics of an embodiment (FIG. 4B ref num 400) with a cascoded unit cell compared to a conventional non-cascoded unit cell (FIG. 4B ref num 402). The x-axis is the voltage on the $V_d$ node of FIG. 4B. The y-axis is the current, in amps, through the fuse resistor components of the unit cell circuits from node $V_d$ to Ground. In FIG. 4A, solid lines represent the current flowing through fuse resistance in cascoded unit cell (FIG. 4B ref. Num. 400) for $V_g$ value ranging from 0.5V (bottom) to 0.9V (top) in 0.1V increments. $V_b$ is fixed at 3.3V. The dashed lines represent non-cascoded fuse resistance current for Vg ranging from 0.5 (bottom) to 1.1V (top) by 0.1V steps.

FIG. 4B shows the cascoded circuit model 400 used in the simulation and the circuit model 402 for a reference cell transistor 404 in accordance with the embodiment of the unit cell 212 of FIG. 2A. The fuse resistances 416 were set at 200 Ohms in both circuits 400, 402. Current-voltage curves were modeled for a cell transistor as shown in FIG. 2A, M12, having a gate seventy microns wide and 0.3 microns long (FIG. 4A), and for a cell with a switch transistor 414 having a gate twenty-eight microns wide and 0.23 microns long cascoded with a tail transistor 415 having a gate 140 microns wide and 0.3 microns long (FIG. 4B). Sizes of the transistors used for various applications in an IC greatly depend on the semiconductor process technology (also known as "node geometry"). In an exemplary technology, the size of a current-controlling cell transistor (e.g., a cell transistor used to control programming current, such as transistor 404 in reference cell 402) is about 70 microns wide and about 0.3 microns long. The size of the switch transistor 414 in the cascoded circuit 400 can be significantly smaller, which makes the cascoded unit cell more area efficient.

In a particular embodiment, a cell transistor (e.g., transistor 414 of the cascode circuit 400) is only 40% of the size of the cell transistor 404 in a conventional cell 402. (i.e., the gate width of 28 microns for the switch transistor 414 is 40% of the 70 micron gate width of transistor 404), to provide a comparable range of operation in saturation mode. The switch transistor 414 is able to be operated in the triode mode because it is not relied upon to control the level of programming current. Rather, the tail transistor 415 controls the programming current.

Table 1 compares the area used for an E-fuse memory array according to the embodiment shown in FIG. 2A compared to the area used in an E-fuse cell in accordance with FIG. 1A. The conventional E-fuse cell (see FIG. 1A, ref. num 100) is about 214.5 microns$^2$ for each unit cell (bit) in a memory array. The E-fuse cell in accordance with the embodiment shown in FIG. 2A is about 64.63 microns$^2$, and uses additional functional blocks, such as the word line decoder 210, bit line program decoder/driver 208, sense amplifier array 204 and bit line READ decoder 206. The area of each of these shared functional blocks is indicated in Table 1, with annotation indicating that the area for shared functional blocks depends on how many word lines and bit lines are in a memory array.

TABLE 1

|  | Area of Unit Cell (FIG. 1A) (microns$^2$) | Area of Memory Array Components (FIG. 2A) (microns$^2$) |  |
| --- | --- | --- | --- |
| Unit cell | 214.50 | 64.63 | each |
| WL Driver | N/A | 239.68 | Per word line |
| BL Pgm Driver | N/A | 440.64 | Per bit line |
| Sense Amps + BL READ Decoder | N/A | 58.75 | Per bit line |

The area reduction of an E-fuse memory array in accordance with the embodiment of FIG. 2A compared to an E-fuse memory array of cells shown in FIG. 1A depends on the number of cells (bits) in the memory. The area reduction improves with increasing bits (unit cells) because the area used by shared functional blocks is averaged over more bits. Table 2 compares the expected areas (in square microns) for memory arrays using unit cells as shown in FIG. 1A versus memory arrays with array cores, unit cells, and functional blocks in accordance with FIG. 2A. Table 2 assumes 32 bit lines. Different areas for embodiments having the same number of bits in an array core can be obtained for different word line/bit line ratios, since the area per bit line of associated functional blocks is greater than the area per word line.

TABLE 2

| Number of Bits (E-fuse unit cells) | Array with Unit Cells of FIG. 1A (microns$^2$) | Array with Array Cores of FIG. 2A (microns$^2$) | Area Reduction |
| --- | --- | --- | --- |
| 128 | 27,456.00 | 25,211.54 | 8.2% |
| 256 | 54,912.00 | 34,442.54 | 37.3% |
| 512 | 109,824.00 | 52,904.53 | 51.8% |
| 1024 | 219,648.00 | 89,828.52 | 59.1% |
| 2048 | 439,296.00 | 163,676.51 | 62.7% |

FIG. 5 is a flow chart of a method of operating an E-fuse memory array 500 according to an embodiment. An array core having a plurality of individually addressable unit cells is provided (step 502), each unit cell having a fuse element and a cell transistor. A unit cell is selected (step 504), and a programming current (see FIG. 2B, ref. num. 230) is coupled from a shared programming voltage source (see Vfs, FIG. 2B) through the selected fuse element and the selected cell transistor to program the selected fuse element (step 506). In a particular embodiment, the programming current flows along a bit line of the array core associated with the selected unit cell, and a word line of the array core associated with the selected unit cell is enabled to turn the cell transistor ON for a selected programming period in response to a programming enable signal. The programming current flows from the cell transistor to ground through a word line ground.

In a further embodiment, the programming enable signal is also applied to a shared tail transistor cascoded with the cell transistor through a word line virtual ground. In a yet further embodiment, a logic gate is disposed between the gate of the cell transistor and the bit line and word line associated with the selected unit cell, the logic gate turning the cell transistor ON when the unit cell is selected.

Typically, several cells in the array core are programmed during an array program operation, unprogrammed cells retaining a first logic value, and programmed cells having a second logic value. In some embodiments, a first plurality of unit cells are programmed by the manufacturer, and other unit cells are subsequently programmed by the user.

After programming the selected unit cell (and typically other unit cells in the array core), a READ current from a READ current source is supplied to the selected unit cell, the READ current flowing through the programmed fuse element and through the selected cell transistor (step 508). A programmed logic state of the selected unit cell is sensed (step 510) according to the READ current flowing through the selected unit cell.

Figure 6:
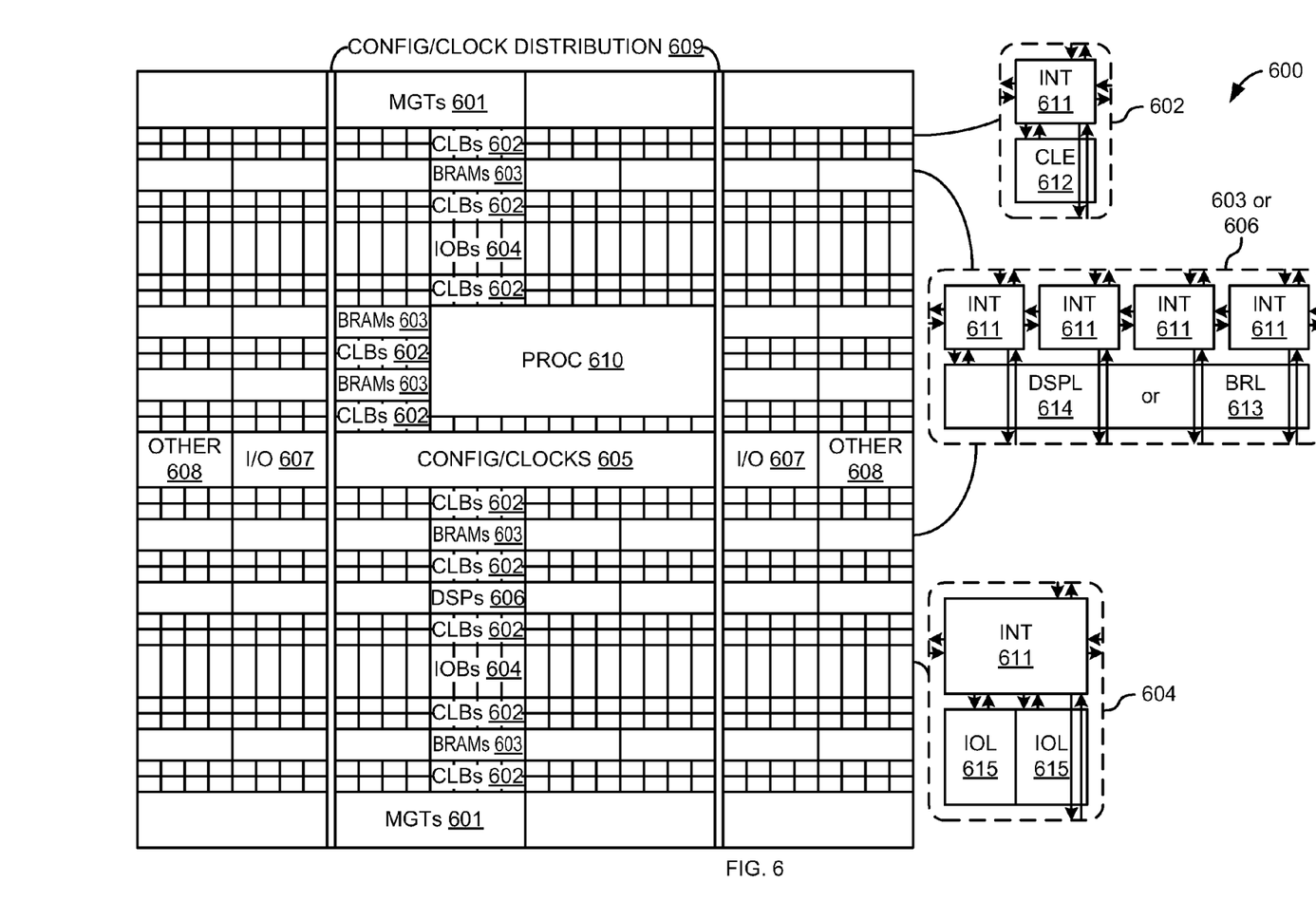
FIG. 6 is a plan view of a field programmable gate array (FPGA) according to an embodiment.

FIG. 6 is a plan view of an FPGA 600 according to an embodiment. The FPGA includes CMOS portions in several of the functional blocks, such as in RAM and logic, and is fabricated using a CMOS fabrication process. E-fuse memory arrays according to one or more embodiments of the invention are incorporated in any of several functional blocks of the IC, such as a memory block, logic block, I/O block, clock circuit, transceiver, or other functional block; within many functional blocks; or within a physical section or segment of the FPGA 600. It is desirable that memory arrays according to embodiments be fabricated using the same CMOS fabrication process used to produce the IC, in other words, that additional process steps do not need to be added to include the memory array; however, additional process steps are added in some embodiments.

E-fuse memory arrays according to one or more embodiments of the invention are particularly desirable for non-reconfigurable, NV memory applications, such as serial numbers, storing security bits that disable selected internal functions of the FPGA, bit-stream encryption key storage, storing repair information for blocks with redundancy, or to provide a user general-purpose one-time programmable NV user-defined bit storage.

The FPGA architecture includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An 10B 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615. In the pictured embodiment, a columnar area near the center of the die is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative layouts of unit cells, fuses, array cores, logic gates, and control devices and circuits could be alternatively used. Therefore, the spirit and scope of the appended claims should not be limited to the foregoing description.

The invention claimed is:

1. A memory array comprising:
an array core having a plurality of individually selectable unit cells, a selectable unit cell including a fuse and a cell transistor having a first current terminal, a second current terminal, and a control terminal, the fuse being coupled to the first current terminal;
a word line coupled to the control terminal;
a word line ground coupled to the second current terminal;
a programming supply node selectively connectable to the selectable unit cell so as to provide a programming current path through the fuse and the cell transistor to the word line ground;
a read current supply selectively connectable to the selectable unit cell so as to provide a read current path through the fuse and the cell transistor to the word line ground; and
a tail transistor disposed in the programming current path between the cell transistor and ground.

2. The memory array of claim 1 wherein the programming supply node is selectively connectable to a bit line associated with the selectable unit cell through a passgate of a bit line program driver and the read current supply is selectively connectable to the bit line through a bit line read switch transistor in a bit line read decoder.

3. The memory array of claim 2 wherein the bit line read switch transistor is disposed in the read current path between a sense amplifier in a sense amplifier array and the array core.

4. The memory array of claim 1 wherein the tail transistor is also in the read current path between the cell transistor and ground.

5. The memory array of claim 1 further comprising a logic gate having a first input coupled to the word line, a second input coupled to a bit line associated with the selectable unit cell, and an output coupled to the control terminal of the cell transistor so as to turn the cell transistor ON when the selectable unit cell is selected for a program operation, and to de-couple the control terminal of the selectable unit cell from at least the bit line when the bit line is not selected.

6. The memory array of claim 1 wherein the fuse is incorporated in a CMOS integrated circuit.

7. The memory array of claim 6 wherein each of the memory array and the CMOS integrated circuited are fabricated using a CMOS fabrication process.

8. The memory array of claim 7 wherein the fuse is an electronic fuse ("E-fuse").

9. The memory array of claim 8 wherein the E-fuse has an E-fuse link comprising polysilicon or silicided polysilicon.

10. The memory array of claim 1 wherein the memory array is programmed to store at least one of a serial number, security bits, block repair information, or a bit-stream encryption key in a field programmable gate array.

11. A method of operating a memory array comprising:
providing an array core having a plurality of individually addressable unit cells, each unit cell having a fuse with a fuse element and a cell transistor;
selecting a unit cell having a selected fuse element and a selected cell transistor;
turning on a tail transistor disposed in a programming current path between the selected cell transistor and ground;
coupling programming current from a programming source through the selected fuse element, the selected cell transistor, and the tail transistor to form a programmed fuse element;
supplying a read current to the selected unit cell, the read current flowing through at least the programmed fuse element and the selected cell transistor; and
sensing a programmed state of the selected unit cell.

12. The method of claim 11 wherein the step of coupling programming current includes coupling programming current through a fuse link of the selected fuse element for a programming period.

13. The method of claim 12 wherein the fuse link comprises polysilicon or silicide and the coupling the programming current through the fuse link for the programming period converts the fuse link from a first resistance to a second resistance, the second resistance being at least five times greater than the first resistance.

14. The method of claim 11 wherein the fuse is an electronic fuse programmed to store a bit of a serial number, a security code disabling a selected internal function, a bitstream encryption key, block repair information, or user-defined value in a field programmable gate array.

15. The method of claim 11 wherein the step of turning on the tail transistor occurs after the selected cell transistor is turned on.

16. The method of claim 15 wherein the step of turning on the tail transistor includes providing a programming pulse to the tail transistor.

17. The method of claim 11 wherein the step of turning on the tail transistor occurs before the selected cell transistor is turned on.

* * * * *